United States Patent
Hata et al.

(10) Patent No.: US 7,822,087 B2
(45) Date of Patent: Oct. 26, 2010

(54) SEMICONDUCTOR LASER DEVICE AND METHOD OF MANUFACTURING THE SAME

(75) Inventors: Masayuki Hata, Kadoma (JP); Kunio Takeuchi, Joyo (JP); Seiichi Tokunaga, Suita (JP)

(73) Assignee: Sanyo Electric Co., Ltd., Osaka (JP)

( * ) Notice: Subject to any disclaimer, the term of this patent is extended or adjusted under 35 U.S.C. 154(b) by 96 days.

(21) Appl. No.: 12/058,729

(22) Filed: Mar. 30, 2008

(65) Prior Publication Data

US 2008/0240187 A1 Oct. 2, 2008

(30) Foreign Application Priority Data

Mar. 30, 2007 (JP) ............................. 2007-094738

(51) Int. Cl.
*H01S 3/04* (2006.01)
(52) U.S. Cl. ................................... 372/43.01; 372/50.1
(58) Field of Classification Search .............. 372/43.01, 372/50.1
See application file for complete search history.

(56) References Cited

U.S. PATENT DOCUMENTS

| | | | |
|---|---|---|---|
| 6,303,405 B1 | 10/2001 | Yoshida et al. | |
| 7,411,988 B2 * | 8/2008 | Tanaka | 372/45.01 |
| 2005/0207463 A1 * | 9/2005 | Nomoto et al. | 372/43.01 |
| 2006/0171435 A1 * | 8/2006 | Ohshima et al. | 372/43.01 |
| 2007/0075320 A1 * | 4/2007 | Hata | 257/79 |
| 2007/0131939 A1 | 6/2007 | Kohda | |

FOREIGN PATENT DOCUMENTS

| | | |
|---|---|---|
| JP | 51-40778 | 4/1976 |
| JP | 10-215031 A | 8/1998 |
| JP | 2000-101139 A | 4/2000 |
| JP | 2000-183438 A | 6/2000 |
| JP | 2005-142347 A | 6/2005 |
| JP | 2005-150255 A | 6/2005 |

OTHER PUBLICATIONS

IEICE Technical Report, LQE 2002-71 to 90, Laser/quantum electronics, Jun. 15, 2002, vol. 102, No. 119, Institute of Electronics, Information and Communication Engineers.
U.S. Office Action for corresponding U.S. Appl. No. 11/529,475, filed Dec. 24, 2008, United States.
Japanese Office Action for corresponding JP Application No. 2005-288254, dated Aug. 31, 2010, pp. 1-7, Japan.

* cited by examiner

*Primary Examiner*—Minsun Harvey
*Assistant Examiner*—Kinam Park
(74) *Attorney, Agent, or Firm*—Ditthavong, Mori & Steiner, P.C.

(57) ABSTRACT

A semiconductor laser device capable of improving planarity of cleavage planes of an optical waveguide thereof is obtained. This semiconductor laser device includes a support substrate, a semiconductor laser element portion having a pair of cavity facets provided with ends of an optical waveguide extending in a first direction and a bonding layer bonding the support substrate and the semiconductor laser element portion to each other, while the bonding layer has void portions formed on regions close to at least the ends of the optical waveguide in the vicinity of the cavity facets.

20 Claims, 16 Drawing Sheets

CLEAVAGE

SEMICONDUCTOR LASER DEVICE AND METHOD OF MANUFACTURING THE SAME

BACKGROUND OF THE INVENTION

Field of the Invention

The present invention relates to a semiconductor laser device and a method of manufacturing the same, and more particularly, it relates to a semiconductor laser device formed by bonding a semiconductor laser element portion and a support substrate to each other and a method of manufacturing the same.

CROSS-REFERENCE TO RELATED APPLICATION

The priority application number JP2007-94738, semiconductor laser device and method of manufacturing the same, Mar. 30, 2007, Masayuki Hata, upon which this patent application is based is hereby incorporated by reference.

DESCRIPTION OF THE BACKGROUND ART

A semiconductor laser device formed by bonding a semiconductor laser element portion and a support substrate to each other and thereafter dividing a substrate provided with the semiconductor laser element portion into each device and a method of manufacturing the same are known in general, as disclosed in The Institute of Electronics, Information and Communication Engineers (IEICE), Technical Report Vol. 102, LQE2002-85, pp. 55 to 57, for example.

The aforementioned IEICE Technical Report Vol. 102, LQE2002-85, pp. 55 to 57 describes a semiconductor laser device manufactured by laser lift-off (LLO) and a method of manufacturing a semiconductor laser device.

Referring to FIG. 28, a contact metal layer 302 consisting of a Ti layer and an Au layer from the lower layer toward the upper layer is formed on a GaAs substrate 301 employed as a support substrate in the conventional semiconductor laser device described in IEICE Technical Report Vol. 102 LQE2002-85, pp. 55 to 57. A first welding layer 303 of Sn is formed on the contact metal layer 302. A second welding layer 304 of Au is formed on the first welding layer 303. A semiconductor element layer 306 having a downwardly protruding ridge portion 305 is formed on the second welding layer 304. A GaN layer 307 is formed on the semiconductor element layer 306. The GaAs substrate 301 and the GaN layer 307 are so formed that cleavage planes thereof coincide with each other. An electrode 308 consisting of a Ti layer, an Al layer, another Ti layer and an Au layer is formed on the GaN layer 307. An electrode 309 consisting of a Ti layer and an Au layer is formed on the back surface of the GaAs substrate 301.

A method of manufacturing the conventional semiconductor laser device is described with reference to FIGS. 28 to 31. First, the GaN layer 307 is grown on the (0001) plane of a sapphire substrate 310 employed as a growth substrate by metal organic chemical vapor deposition (MOCVD), as shown in FIG. 29. Then, the semiconductor element layer 306 having the ridge portion 305 is grown on the GaN layer 307. Thereafter the second welding layer 304 of Au is formed on the semiconductor element layer 306.

Then, the contact metal layer 302 consisting of the Ti layer and the Au layer is formed on the GaAs substrate 301, as shown in FIG. 30. The first welding layer 303 of Sn is formed on the contact metal layer 302. The first welding layer 303 and the second welding layer 304 are bonded to each other, so that the cleavage planes of the GaAs substrate 301 and the GaN layer 307 coincide with each other. Thereafter the semiconductor laser device is held in a nitrogen atmosphere at a temperature of about 310° C. for about 10 minutes. Thus, Sn forming the first welding layer 303 and Au forming the second welding layer 304 are so alloyed that the GaN layer 307 provided on the sapphire substrate 310 and the GaAs substrate 301 are bonded to each other, as shown in FIG. 31.

Thereafter fourth harmonic waves of an Nd-YAG laser having a wavelength of 266 nm are applied from the side of the sapphire substrate 310, for decomposing GaN into Ga metal and nitrogen on the interface between the sapphire substrate 310 and the GaN layer 307 through heat generated upon laser application. Thus, the sapphire substrate 310 is removed from the GaN layer 307. After this removal of the sapphire substrate 310, the Ga metal adhering to the surface of the GaN layer 307 is removed by hydrochloric acid cleaning. Then, the electrode 308 consisting of the Ti layer, the Al layer, the other Ti layer and the Au layer from the lower layer toward the upper layer is formed on the GaN layer 307 while the electrode 309 consisting of the Ti layer and the Au layer from the upper layer toward the lower layer is formed on the back surface of the GaAs substrate 301, as shown in FIG. 28.

Finally, the GaN layer 307 is cleaved along the cleavage planes, thereby dividing the semiconductor laser device. Thus, cavity facets of the semiconductor device are formed. The conventional semiconductor laser device described in the IEICE Technical Report Vol. 102 LQE2002-85, pp. 55 to 57 is manufactured in this manner. According to this method, the insufficiently cleavable sapphire substrate 310 employed as the growth substrate can be removed, whereby cleavability of the nitride-based semiconductor laser device can be improved. If a GaN substrate is employed as the growth substrate in place of the sapphire substrate 310, the cost can be reduced by separating and recycling the high-priced GaN substrate. Therefore, the technique of bonding the semiconductor laser element portion and the support substrate to each other is effectively applied to a method of manufacturing a semiconductor laser device.

In the conventional semiconductor laser device described in IEICE Technical Report Vol. 102 LQE2002-85, pp. 55 to 57, however, the semiconductor element layer 306 is bonded to the GaAs substrate 301 through the second welding layer 304 of Au having no cleavability, and hence planarity of cleavage planes of an optical waveguide of the semiconductor laser device is disadvantageously reduced due to the uncleavable second welding layer 304 of Au formed between the GaAs substrate 301 and the GaN layer 307, despite cleavability of the GaAs substrate 301. If a metal substrate of Cu—W or the like having no cleavability is employed in place of the cleavable GaAs substrate 301 as the support substrate, further, the planarity of the cleavage planes of the optical waveguide of the semiconductor laser device is disadvantageously further reduced.

SUMMARY OF THE INVENTION

A semiconductor laser device according to a first aspect of the present invention comprises a support substrate, a semiconductor laser element portion having a pair of cavity facets provided with ends of an optical waveguide extending in a first direction and a bonding layer bonding the support substrate and the semiconductor laser element portion to each other, while the bonding layer has void portions formed on regions close to at least the ends of the optical waveguide in the vicinity of the cavity facets.

A method of manufacturing a semiconductor laser device according to a second aspect of the present invention comprises steps of bonding a support substrate and a semiconductor laser element portion having an optical waveguide extending in a first direction to each other through a bonding layer and forming a pair of cavity facets on regions forming ends of the optical waveguide, while the bonding step includes steps of forming the bonding layer having void portions on regions close to at least the regions forming the ends of the optical waveguide in the vicinity of regions forming the cavity facets between the support substrate and the semiconductor laser element portion and bonding the support substrate and the semiconductor laser element portion to each other through the bonding layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

First, the structure of a semiconductor laser device according to a first embodiment of the present invention is described with reference to FIGS. 1 to 5.

Figure 1:
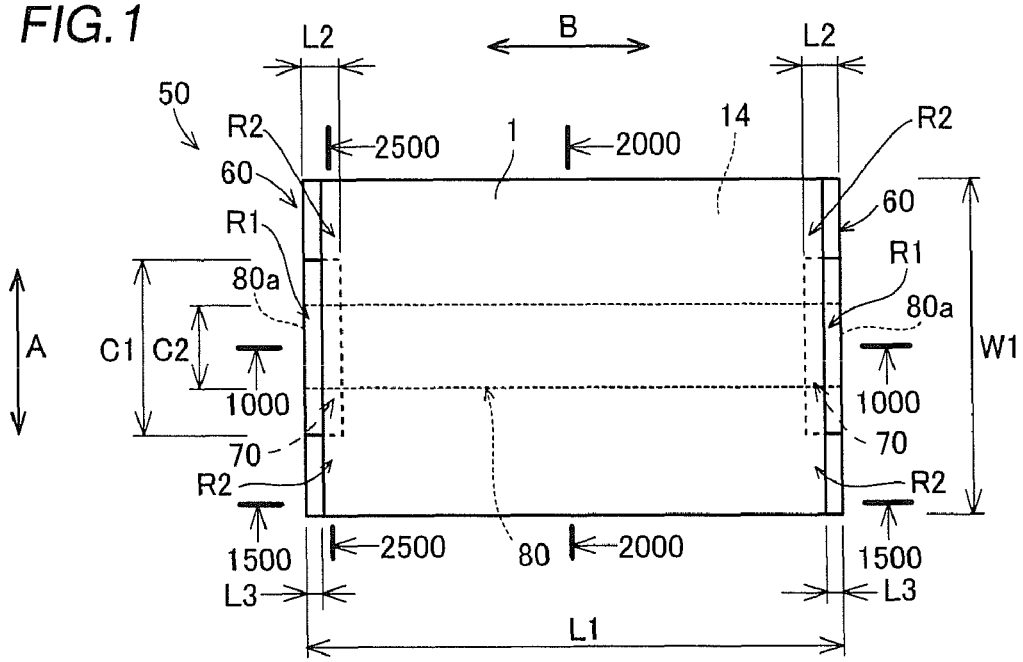
FIG. 1 is a plan view of a semiconductor laser device according to a first embodiment of the present invention.
Figure 2:
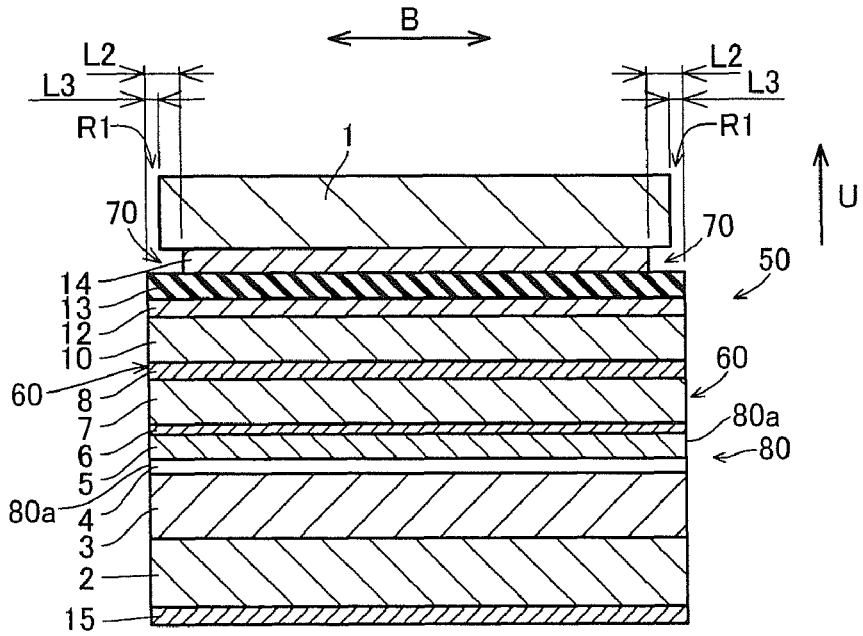
FIG. 2 is a sectional view of the semiconductor laser device according to the first embodiment taken along the line 1000-1000 in FIG. 1.

In the semiconductor laser device according to the first embodiment, an electrically conductive support substrate 1 of Cu—W having no cleavability and a semiconductor laser element portion 50 are bonded to each other through an electrically conductive solder layer 14 of AuSn, as shown in FIGS. 1 and 2. The solder layer 14 is an example of the "bonding layer" in the present invention. The semiconductor laser element portion 50 is provided with a pair of cavity facets 60 consisting of cleavage planes extending in a direction A. The direction A is an example of the "second direction" in the present invention. As shown in FIG. 1, the semiconductor laser element 50 has a length (cavity length) L1 of about 600 μm in a direction B and a width W1 of about 400 μm in the direction A. The direction B is an example of the "first direction" in the present invention.

According to the first embodiment, void portions 70 are formed on planar regions R1 close to ends 80a of an optical waveguide 80 (see FIG. 1) described later and located above the ends 80a of the optical waveguide 80 (along arrow U) in the vicinity of the cavity facets 60 of the semiconductor laser element portion 50 between the support substrate 1 and the semiconductor laser element portion 50. The void portions 70 provided with no solder layer 14 are inwardly separated from extension lines of the cavity facets 60 by an interval (L2) of about 25 μm with a width (C1) around the optical waveguide 80, as shown in FIG. 1. In other words, the width (C1=about 50 μm) of the void portions 70 in the direction A is larger than the width (C2=about 1.5 μm), described later, of the optical waveguide 80 in the direction A. C1 is an example of the "width of void portions" in the present invention, and C2 is an example of the "width of ends of optical waveguide" in the present invention.

Figure 3:
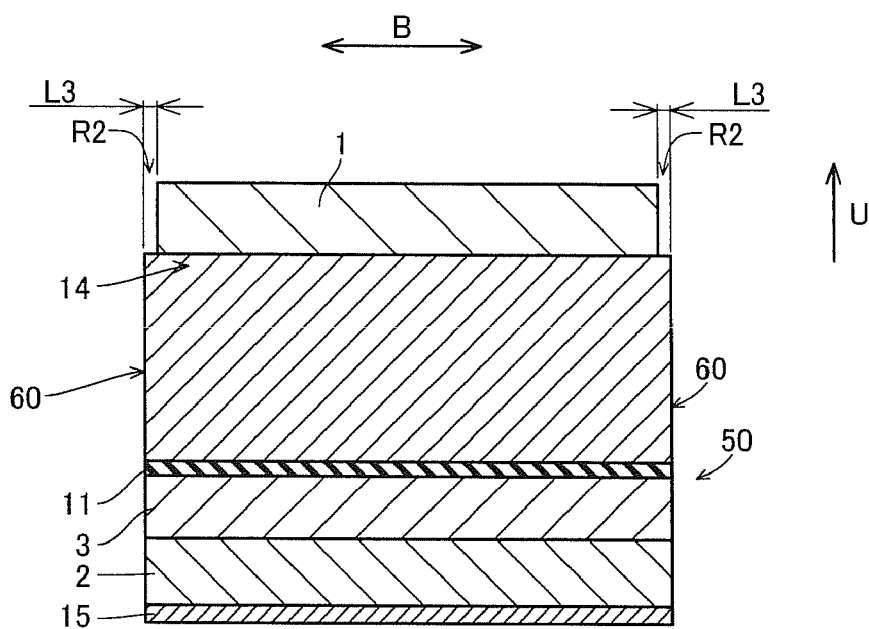
FIG. 3 is a sectional view of the semiconductor laser device according to the first embodiment taken along the line 1500-1500 in FIG. 1.

According to the first embodiment, the support substrate 1 and the semiconductor laser element portion 50 are bonded to each other through the solder layer 14 on planar regions R2 other than those close to the ends 80a of the optical waveguide 80 in the vicinity of the cavity facets 60 of the semiconductor laser element portion 50 between the support substrate 1 and the semiconductor laser element portion 50, as shown in FIGS. 1 and 3. In addition, the support substrate 1 and the semiconductor laser element portion 50 are bonded to each other through the solder layer 14 on portions adjacent to the void portions 70 in the direction B and portions adjacent to the planar regions R2 in the direction B, as shown in FIGS. 1 and 2.

Side end surfaces of the support substrate 1 are formed on positions inwardly deviating from the extension lines of the cavity facets 60 by a length (L3) of about 20 μm by dicing for dividing the device as described later.

Figure 4:
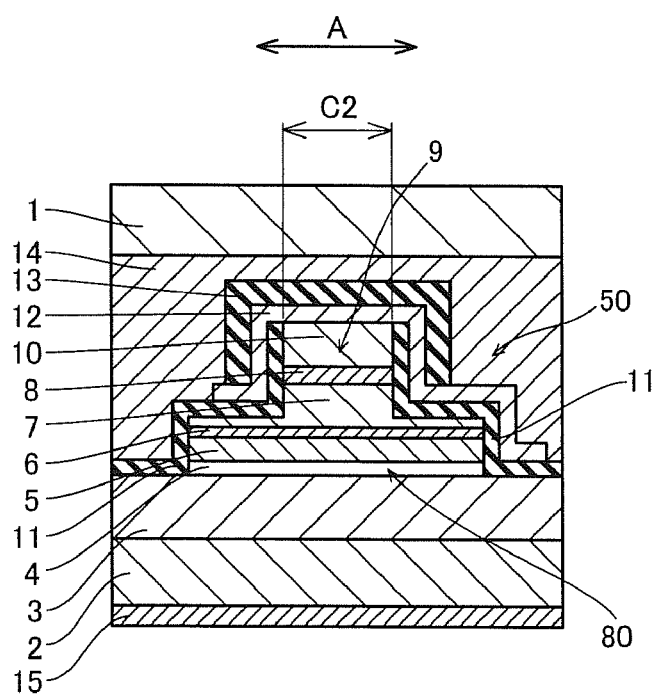
FIG. 4 is a sectional view of the semiconductor laser device according to the first embodiment taken along the line 2000-2000 in FIG. 1.
Figure 5:
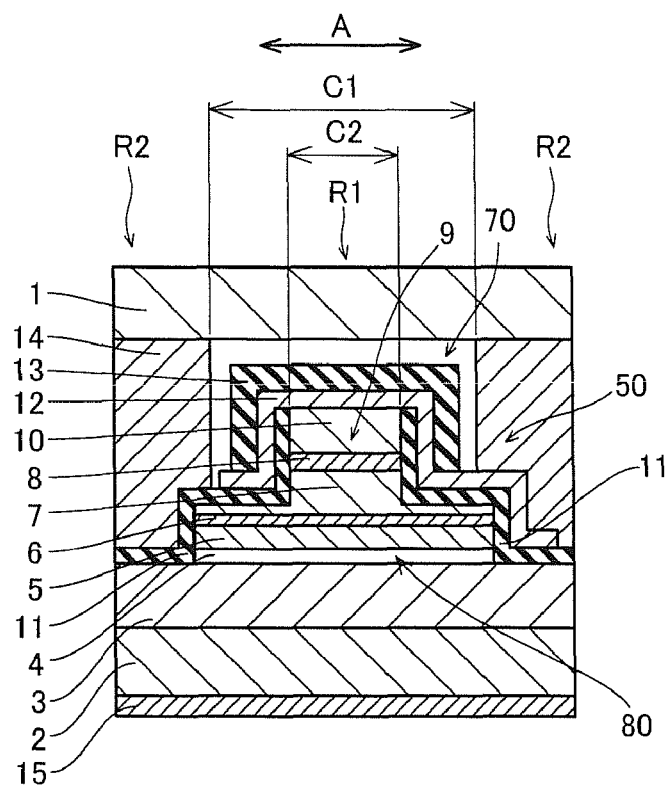
FIG. 5 is a sectional view of the semiconductor laser device according to the first embodiment taken along the line 2500-2500 in FIG. 1.

As shown in FIGS. 2 and 4, an n-type cladding layer 3 having a thickness of about 400 nm and consisting of $Al_{0.07}Ga_{0.93}N$, having a carrier concentration of about $5 \times 10^{18}$ $cm^{-3}$, doped with Si of about $5 \times 10^{18}$ $cm^{-3}$ is formed on an n-type contact layer 2 having a thickness of about 5 μm and consisting of GaN, having a carrier concentration of about $5 \times 10^{18}$ $cm^{-3}$, doped with Si of about $5 \times 10^{18}$ $cm^3$. An emission layer 4 having a width of about 4.5 μm smaller than the width of the support substrate 1 is formed on the n-type cladding layer 3.

Figure 6:
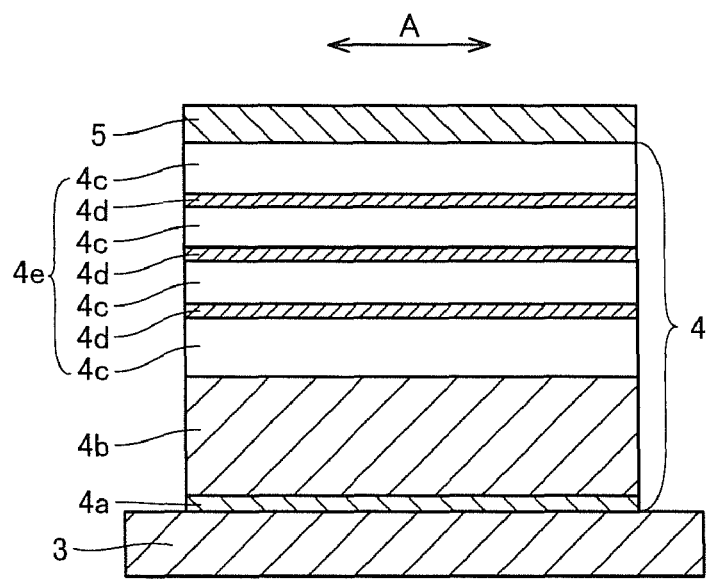
FIG. 6 is a sectional view showing the structure of an emission layer of the semiconductor laser device according to the first embodiment shown in FIG. 1.

In this emission layer 4, an n-type carrier blocking layer 4a having a thickness of about 5 nm and consisting of $Al_{0.16}Ga_{0.84}N$, having a carrier concentration of about $5 \times 10^{18}$ $cm^{-3}$, doped with Si of about $5 \times 10^{18}$ $cm^{-3}$ is formed on the n-type cladding layer 3, as shown in FIG. 6. An n-type light guide layer 4b having a thickness of about 100 nm and consisting of GaN doped with Si is formed on the n-type carrier blocking layer 4a. A multiple quantum well (MQW) active layer 4e obtained by alternately stacking four barrier layers 4a having a thickness of about 20 nm and consisting of undoped $In_{0.02}Ga_{0.98}N$ and three quantum well layers 4d having a thickness of about 3 nm and consisting of undoped $In_{0.15}Ga_{0.85}N$ is formed on the n-type light guide layer 4b. The n-type carrier blocking layer 4a, the n-type light guide layer 4b and the MQW active layer 4e constitute the emission layer 4.

A p-type light guide layer 5 having a thickness of about 100 nm and consisting of GaN doped with Mg of about $4 \times 10^{19}$ $cm^{-3}$ is formed on the uppermost barrier layer 4c of the emission layer 4, as shown in FIGS. 4 and 6. A p-type cap layer 6 having a thickness of about 20 nm and consisting of $Al_{0.16}Ga_{0.84}N$ doped with Mg of about $4 \times 10^{19}$ $cm^{-3}$ is formed on the p-type light guide layer 5, as shown in FIG. 4. A p-type cladding layer 7 having a projecting portion and consisting of $Al_{0.07}Ga_{0.93}N$, having a carrier concentration of about $5 \times 10^{17}$ $cm^{-3}$, doped with Mg of about $4 \times 10^{19}$ $cm^{-3}$ is formed on is formed on the p-type cap layer 6. The thickness of the projecting portion of the p-type cladding layer 7 is about 400 nm, and the thickness of a planar portion of the p-type cladding layer 7 other than the projecting portion is about 80 nm. A p-type contact layer 8 having a thickness of about 10 nm and consisting of $In_{0.02}Ga_{0.98}N$, having a carrier concentration of about $5 \times 10^{17}$ $cm^{-3}$, doped with Mg of about $4 \times 10^{19}$ $cm^{-3}$ is formed on the upper surface of the projecting portion of the p-type cladding layer 7. The projecting portion of the p-type cladding layer 7 and the p-type contact layer 8 constitute a ridge portion 9 forming a current path. This ridge portion 9 has a width of about 1.5 μm and a height of about 380 nm. A p-side ohmic electrode 10 constituted of a Pt layer having a thickness of about 5 nm, a Pd layer having a thickness of about 100 nm and an Au layer having a thickness of about 150 nm from the lower layer toward the upper layer is formed on the p-type contact layer 8. The optical waveguide 80 extending in the direction (direction B) perpendicular to the cavity facets 60 is formed on a portion including regions of the emission layer 4 and the p-type light guide layer 5, having a width (C2) of about 1.5 μm, located under the ridge portion 9.

As shown in FIG. 4, an insulating film 11 of $SiN_x$ having a thickness of about 250 nm is formed on the upper surface of the n-type cladding layer 3 and the side surfaces of the emission layer 4, the p-type light guide layer 5, the p-type cap layer 6, the ridge portion 9 and the p-side ohmic electrode 10. A p-side pad electrode 12 consisting of a Ti layer having a thickness of about 100 nm, a Pd layer having a thickness of about 100 nm and an Au layer having a thickness of about 3000 nm from the lower layer toward the upper layer is formed on the upper surfaces of the insulating film 11 and the p-side ohmic electrode 10 with a width of about 125 μm. Another insulating film 13 of $SiO_2$ having a thickness of about 100 nm is formed on the p-side pad electrode 12. This insulating film 13 has a function of suppressing reaction between the solder layer 14 and the p-type ohmic electrode 10. The semiconductor laser element portion 50 is constituted in this manner, and bonded to the support substrate 1 through the solder layer 14.

As shown in FIG. 4, an n-side electrode 15 consisting of an n-side ohmic electrode, an n-side barrier metal and an n-side pad metal from the side close to the n-type contact layer 4 is formed on the back surface of the n-type contact layer 2. The n-side ohmic electrode constituting the n-side electrode 15 is made of Al, and the n-side barrier metal is made of Pt or Ti. The n-side barrier metal has a function of suppressing reaction between the n-side ohmic electrode and the n-side pad electrode.

According to the first embodiment, as hereinabove described, the bonding layer 14 is provided with the void portions 70 formed on the regions close to the ends 80a of the optical waveguide 80 in the vicinity of the cavity facets 60 so that the semiconductor laser element portion 50 can be arranged in the state isolated from the support substrate 1 without through the solder layer 14 on the planar regions R1 corresponding to the ends 80a of the optical waveguide 80, whereby the optical waveguide 80 of the semiconductor laser element portion 50 can be cleaved with no influence from cleavability of the support substrate 1. Thus, planarity of the cleavage planes of the optical waveguide 80 of the semiconductor laser element portion 50 can be improved. Further, the support substrate 1 and the semiconductor laser element portion 50 are bonded to each other through the solder layer 14 formed on the region other than those close to the ends 80a of the optical waveguide 80 in the vicinity of the cavity facets 60 so that reduction of the bonding area between the support substrate 1 and the semiconductor laser element portion 50 can be suppressed despite the void portions 70, whereby the semiconductor laser element portion 50 can be prevented from cracking when a sapphire substrate 20 employed as a growth substrate is separated from the semiconductor laser element portion 50 in a manufacturing process described later.

According to the first embodiment, the width C1 of the void portions 70 in the direction A is rendered larger than the width C2 of the optical waveguide 80 in the direction A, whereby the optical waveguide 80 of the semiconductor laser element portion 50 can be cleaved with no influence from cleavability of the support substrate 1.

While the support substrate 1 has no cleavability on the plane along the direction (direction A) parallel to the cavity facets 60 according to the first embodiment, the semiconductor laser element portion 50 is hardly influenced by the uncleavability of the support substrate 1. Thus, planarity of the cleavage planes of the optical waveguide 80 of the semiconductor laser element portion 50 can be easily improved.

According to the first embodiment, the support substrate 1 and the solder layer 14 are formed to be electrically conductive so that the electrically conductive support substrate 1 and the semiconductor laser element portion 50 can be bonded to each other through the electrically conductive solder layer 14, whereby the semiconductor laser element portion 50 and the support substrate 1 can be electrically connected with each other.

The manufacturing process for the semiconductor laser device according to the first embodiment is now described with reference to FIGS. 1 and 6 to 15. FIGS. 7, 9, 10, 12 and 13 are sectional views along the same direction as FIG. 4, and FIGS. 11 and 15 are sectional views along the same direction as FIG. 2.

Figure 7:
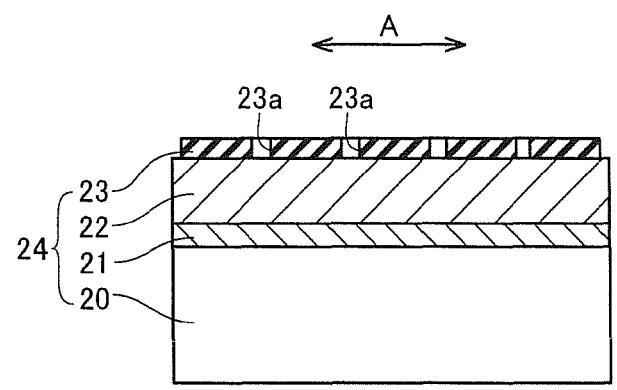
FIG. 7 is a sectional view taken along the line 2000-2000 in FIG. 1, for illustrating a manufacturing process for the semiconductor laser device according to the first embodiment shown in FIG. 1.

First, a buffer layer 21 and a GaN layer 22 are successively grown on the sapphire substrate 20 employed as the growth substrate by MOCVD, as shown in FIG. 7. The sapphire substrate 20 is an example of the "growth substrate" in the present invention.

Figure 8:
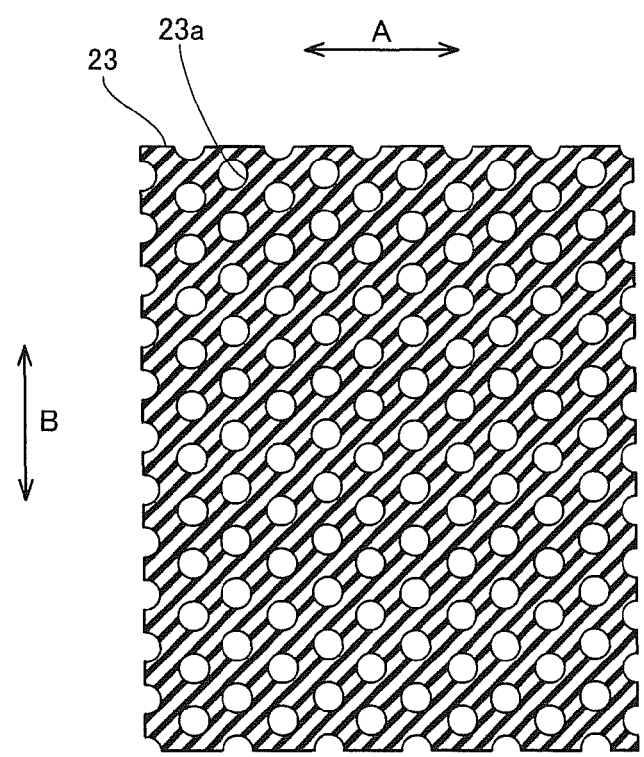
FIG. 8 is a plan view for illustrating a triangular lattice pattern of the semiconductor laser device according to the first embodiment shown in FIG. 1.

More specifically, the buffer layer 21 of GaN having a thickness of about 20 nm is grown on the (0001) plane of the sapphire substrate 20 kept at a growth temperature of about 600° C. Then, the GaN layer 22 having a thickness of about 2 µm is grown on the buffer layer 21 while keeping the sapphire substrate 20 at a growth temperature of about 1050° C. Then, a mask 23 consisting of an $SiO_2$ film is formed on the GaN layer 22. This mask 23 has a triangular lattice pattern constituted of openings 23a, having a diameter of about 2 µm, formed by general lithography, as shown in FIG. 8. The sapphire substrate 20, the buffer layer 21, the GaN layer 22 and the mask 23 constitute an underlayer for selective growth 24.

Figure 9:
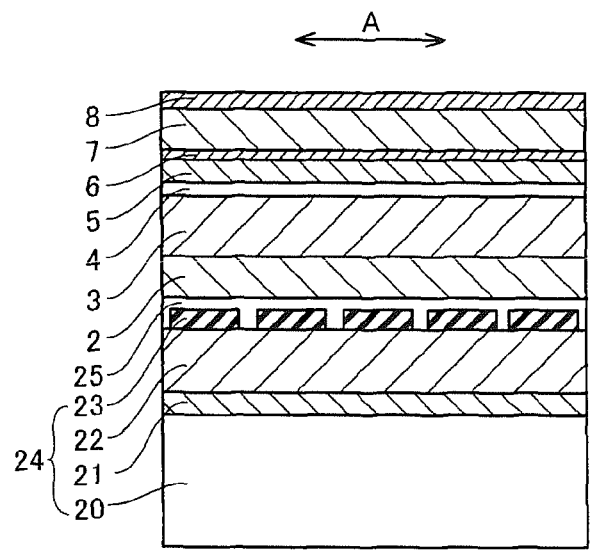
FIGS. 9 and 10 are sectional views taken along the line 2000-2000 in FIG. 1, for illustrating the manufacturing process for the semiconductor laser device according to the first embodiment shown in FIG. 1.

Then, a layer for separation 25 of $In_{0.35}Ga_{0.65}N$ having a thickness of about 20 nm is grown on the underlayer for selective growth 24 by MOCVD while keeping the sapphire substrate 20 at a growth temperature of about 600° C., as shown in FIG. 9. The layer for separation 25 is made of a material having a smaller band gap than the active layer 4e (see FIG. 6). More specifically, the layer for separation 25 is made of InGaN having a higher In composition than InGaN forming the active layer 4e according to the first embodiment. Then, the n-type contact layer 2 and the n-type cladding layer 3 are successively grown on the layer for separation 25 while keeping the sapphire substrate 20 at a growth temperature of about 1100° C. Then, the emission layer 4, the p-type light guide layer 5 and the p-type cap layer 6 are successively grown on the n-type cladding layer 3 while keeping the sapphire substrate 20 at a growth temperature of about 800° C. Then, the p-type cladding layer 7 having the thickness of about 400 nm is grown on the p-type cap layer 6 while keeping the sapphire substrate 20 at a growth temperature of about 1100° C. Each of the layers from the GaN layer 22 up to the p-type contact layer 8 has the polarity of a nitrogen face on the side closer to the sapphire substrate 20 and the polarity of a Ga face in the direction of progress of crystal growth. Further, the layer for separation 25 is so laterally grown on the mask 23 that the dislocation density thereof is reduced. Consequently, the dislocation densities of the layers from the n-type contact layer 2 up to the p-type contact layer 8 formed on the layer for separation 25 are reduced. Thereafter annealing is performed in an $N_2$ atmosphere while keeping the sapphire substrate 20 at a growth temperature of about 800° C., thereby activating acceptors of the p-type nitride semiconductor layers and obtaining a prescribed hole concentration.

Then, the p-side ohmic electrode 10 (see FIG. 10) and an insulating film (not shown) of $SiO_2$ having a thickness of about 0.25 µm are successively formed on the surface of the p-type contact layer 8 by vacuum evaporation or the like and thereafter patterned, thereby obtaining the p-side ohmic electrode 10 and the insulating film (not shown) formed on a prescribed region of the surface of the p-type contact layer 8. The p-side ohmic electrode 10 is formed by stacking the Pt layer having the thickness of about 5 nm, the Pd layer having the thickness of about 100 nm and the Au layer having the thickness of about 150 nm from the side closer to the p-type contact layer 8.

Figure 10:
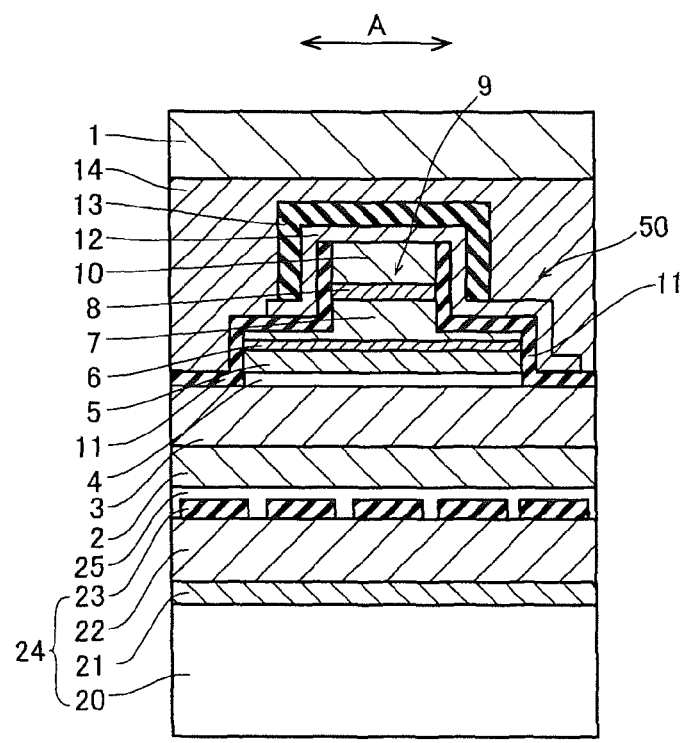
Figure 11:
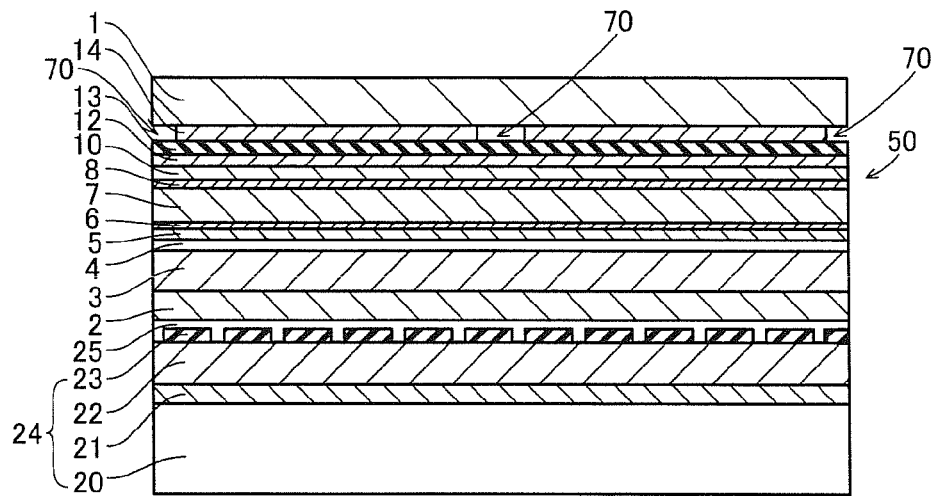
FIG. 11 is a sectional view taken along the line 1000-1000 in FIG. 1, for illustrating the manufacturing process for the semiconductor laser device according to the first embodiment shown in FIG. 1.

Then, dry etching is performed with $Cl_2$-based gas through a mask of the insulating film (not shown) while keeping the sapphire substrate 20 at a temperature of about 200° C. for partially removing the p-type contact layer 8 and the p-type cladding layer 7, thereby forming the ridge portion 9 (see FIG. 10). This ridge portion 9 has the width of about 1.5 µm and the height of about 380 nm. Then, the emission layer 4, the light guide layer 5, the p-type cap layer 6 and the planar portion of the p-type cladding layer 7 are partially etched by photolithography and dry etching, thereby patterning the emission layer 4, the light guide layer 5, the p-type cap layer 6 and the p-type cladding layer 7 to a width of about 4.5 µm. Thereafter the insulating film 11 (see FIG. 10) of $SiN_x$ having the thickness of about 250 nm is formed to cover the upper surface of the n-type cladding layer 3, the side surfaces of the emission layer 4, the p-type light guide layer 5, the p-type cap layer 6 and the planar portion of the p-type cladding layer 7, the upper surface of the planar portion of the p-type cladding layer 7, the side surface of the ridge portion 9 and the upper surface of the insulating film (not shown), and only the part of the insulating film 11 located on the p-side ohmic electrode 10 is removed.

Then, the p-side pad electrode 12 (see FIG. 10) consisting of the Ti layer having the thickness of about 100 nm, the Pd layer having the thickness of about 100 nm and the Au layer having the thickness of about 3000 nm from the lower layer toward the upper layer is formed on the p-side ohmic electrode 10 and the insulating film 11 (see FIG. 10). Then, the insulating film 13 (see FIG. 10) of $SiO_2$ having the thickness of about 100 nm is formed on the p-side pad electrode 12. Thereafter the semiconductor laser element portion 50 is bonded to the support substrate 1 through the solder layer 14 of AuSn having the thickness of about 5 μm, as shown in FIG. 10.

Figure 12:
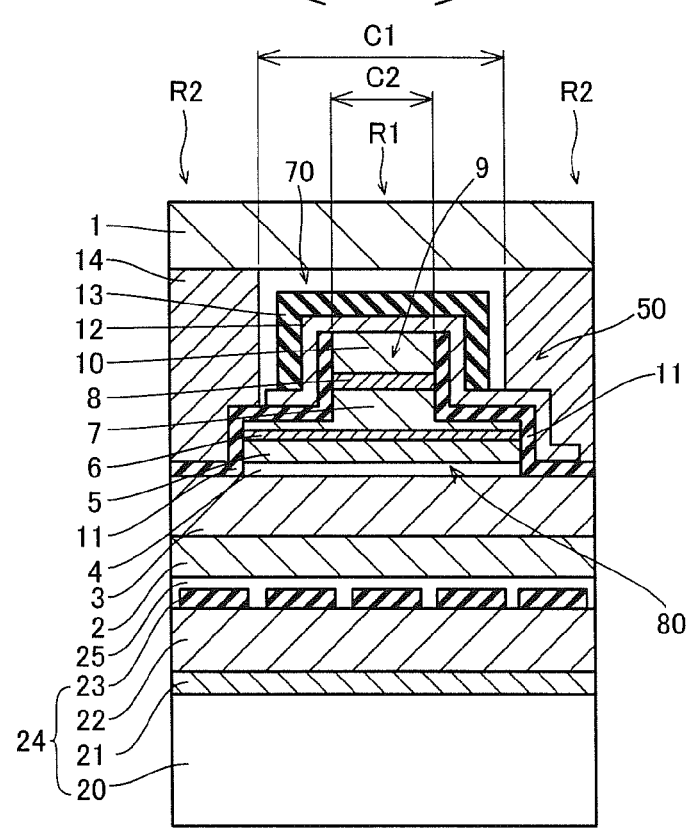
FIG. 12 is a sectional view taken along the line 2500-2500 in FIG. 1, for illustrating the manufacturing process for the semiconductor laser device according to the first embodiment shown in FIG. 1.
Figure 13:
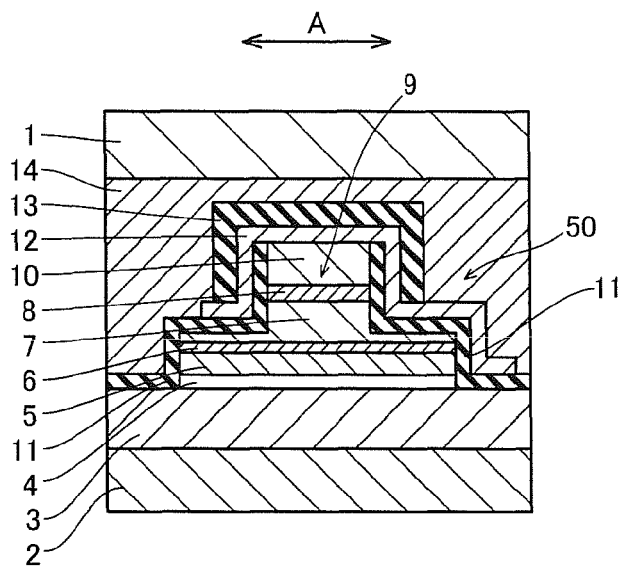
FIG. 13 is a sectional view taken along the line 2000-2000 in FIG. 1, for illustrating the manufacturing process for the semiconductor laser device according to the first embodiment shown in FIG. 1.
Figure 14:
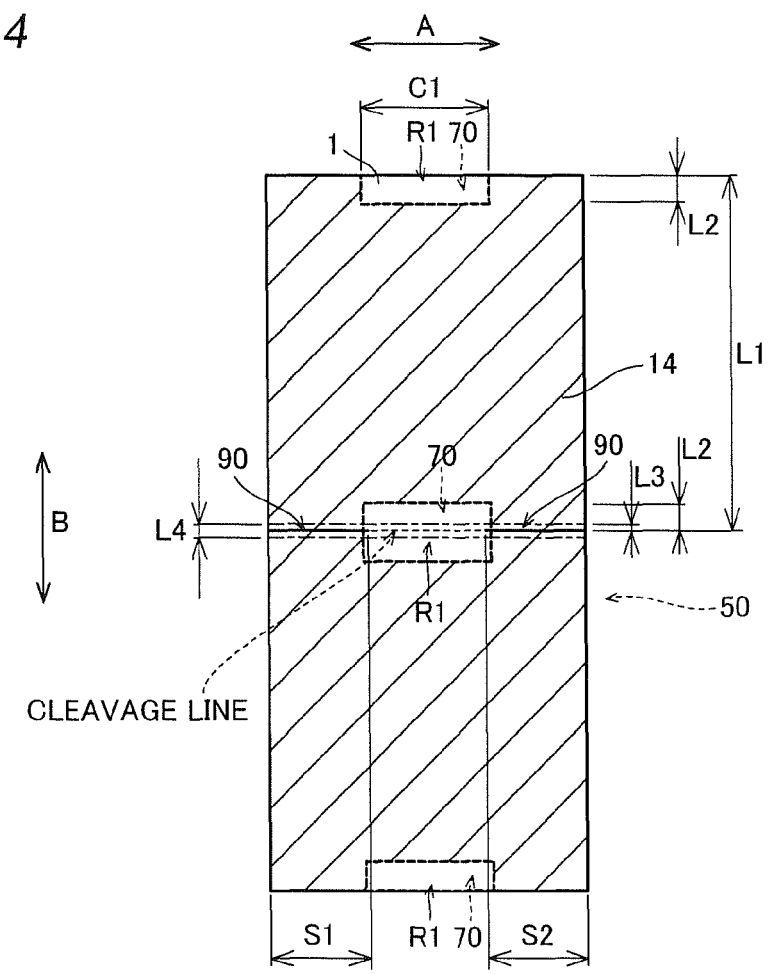
FIG. 14 is a plan view for illustrating the manufacturing process for the semiconductor laser device according to the first embodiment shown in FIG. 1.
Figure 15:
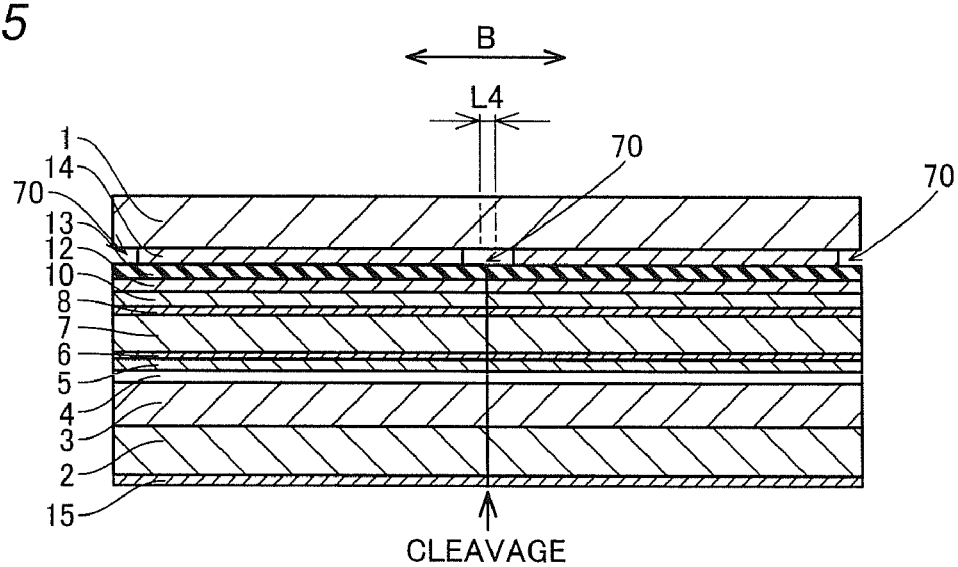
FIG. 15 is a sectional view taken along the line 1000-1000 in FIG. 1, for illustrating the manufacturing process for the semiconductor laser device according to the first embodiment shown in FIG. 1.

According to the first embodiment, the solder layer 14 is previously formed on a region (hatched region in FIG. 14) other than the planar regions R1 in the vicinity of regions for forming the ends 80a (see FIG. 1) of the optical waveguide 80 on the surface of the support substrate 1 closer to the semiconductor laser element portion 50, as shown in FIG. 14. The semiconductor laser element portion 50 and the support substrate 1 are so bonded (welded) to each other as to form the void portions 70 provided with no solder layer 14, as shown in FIGS. 11 and 12. Further, the semiconductor laser element portion 50 is so bonded to the support substrate 1 that the void portions 70 are located above the ridge portion 9, as shown in FIG. 12. Thereafter a laser beam of 532 nm irradiates at the layer for separation 25 for decomposing and evaporating the layer for separation 25, thereby separating the underlayer for selective growth 24 (see FIG. 10) from the semiconductor laser element portion 50, as shown in FIG. 13. The laser beam of 532 nm is absorbed by the layer for separation 25, and not absorbed by the support substrate 1 and the semiconductor laser element portion 50. According to the first embodiment, the layer for separation 25 is made of the material having the smaller band gap than the semiconductor layers, and easily decomposed as compared with the semiconductor layers. The layer for separation 25 may alternatively be made of a material having a melting point or a boiling point lower than those of the semiconductor layers, so that the underlayer for selective growth 24 can be easily separated from the semiconductor laser element portion 50. Thus, the semiconductor laser element 50 bonded to the support substrate 1 is separated from the sapphire substrate 20 (underlayer for selective growth 24) (see FIG. 10) for exposing the overall surface of the opposite side of the n-type contact layer 2 to the support substrate 1, thereby obtaining the shape shown in FIGS. 13 and 15. As shown in FIG. 12, the support substrate 1 and the semiconductor laser element portion 50 are bonded to each other through the solder layer 14 on the planar regions R2 adjacent to the void portions 70 in the direction A, whereby the semiconductor laser element portion 50 can be prevented from cracking when separated from the sapphire substrate 20 (underlayer for selective growth 24).

Thereafter the n-side electrode 15 including the n-side ohmic electrode of Al having a thickness of about 10 nm, the n-side barrier metal of Pt having a thickness of about 20 nm and the n-side pad electrode of Au having a thickness of about 300 nm from the side closer to the n-type contact layer 2 is formed on the back surface of the n-type contact layer 2, as shown in FIG. 15.

As shown in FIG. 14, scribing grooves 90 are provided to pass through the semiconductor laser element portion 50 over lengths S1 and S2 on the portion provided with the solder layer 14 and parts of the void portions 70 in the regions for forming the cavity facets 60 (see FIG. 1). The scribing grooves 90 are formed by laser scribing or mechanical scribing. Thereafter the semiconductor laser element portion 50 is cleaved along the (1-100) plane with ultrasonic waves.

Finally, only the support substrate 1 is diced with a width (L4) of about 40 μm thereby dividing the semiconductor laser element portion 50, as shown in FIGS. 14 and 15. Thus, the semiconductor laser device according to the first embodiment shown in FIG. 1 is formed.

In the manufacturing process for the semiconductor laser device according to the first embodiment, as hereinabove described, the step of forming the solder layer 14 having the void portions 70 includes the step of forming the solder 14 on the region of the surface of the support substrate 1 other than those for forming the void portions 70 so that the regions (void portions 70) provided with no solder layer 14 can be formed on the surface of the support substrate 1, whereby the void portions 70 can be easily formed between the support substrate 1 and the semiconductor laser element portion 50 when the support substrate 1 and the semiconductor laser element portion 50 are bonded to each other.

As hereinabove described, the manufacturing process for the semiconductor laser device according to the first embodiment comprises the steps of forming the semiconductor laser element portion 50 with the sapphire substrate 20 and separating the sapphire substrate 20 from the semiconductor laser element portion 50 after the step of bonding the support substrate 1 and the semiconductor laser element portion 50 to each other, whereby the semiconductor laser element portion 50 can be easily cleaved even when the sapphire substrate 20 is inferior in cleavability. The manufacturing process further comprises the step of bonding the support substrate 1 and the semiconductor laser element portion 50 to each other through the solder layer 14 on the region other than the regions forming the ends 80a of the optical waveguide 80 in the vicinity of the regions forming the cavity facets 60, whereby reduction of the bonding area between the support substrate 1 and the semiconductor laser element portion 50 can be suppressed despite the void portions 70. Thus, the semiconductor laser element portion 50 can be prevented from cracking when the sapphire substrate 20 is separated from the semiconductor laser element portion 50.

As hereinabove described, the manufacturing process for the semiconductor laser device according to the first embodiment comprises the step of dividing the support substrate 1 after the step of forming the pair of cavity facets 60 on the semiconductor element portion 50 so that the support substrate 1 is not yet finely divided in formation of the cavity facets 60 dissimilarly to a case of comprising the step of dividing the support substrate 1 in advance of the step of forming the cavity facets 60, whereby alignment for forming the scribing grooves 90 is simplified so that the step necessary for cleavage can be easily carried out.

Second Embodiment

In a semiconductor laser device according to a second embodiment of the present invention, cleavage planes (cavity facets 61) are formed by protruding a ridge portion 9 forming the cleavage planes and a region located under the ridge portion 9 from side end surfaces of a semiconductor laser element portion 50a by rendering the width W2 of the semiconductor laser element portion 50a in a direction A in the vicinity of ends 81a of an optical waveguide 81 smaller than a width C1 of void portions 71 in the direction A and larger than a width C2 of the ends 81a of the optical waveguide 81 in the direction A dissimilarly to the aforementioned first embodiment, as shown in FIGS. 16 to 19. The remaining structure of the second embodiment is similar to that of the aforementioned first embodiment.

According to the second embodiment, the semiconductor laser element portion 50a identical in structure to the semiconductor laser element portion 50 according to the aforementioned first embodiment except the cavity facets 60 is bonded to an electrically conductive support substrate 1 of Cu—W having no cleavability through an electrically conductive solder layer 14 of AuSn.

Figure 16:
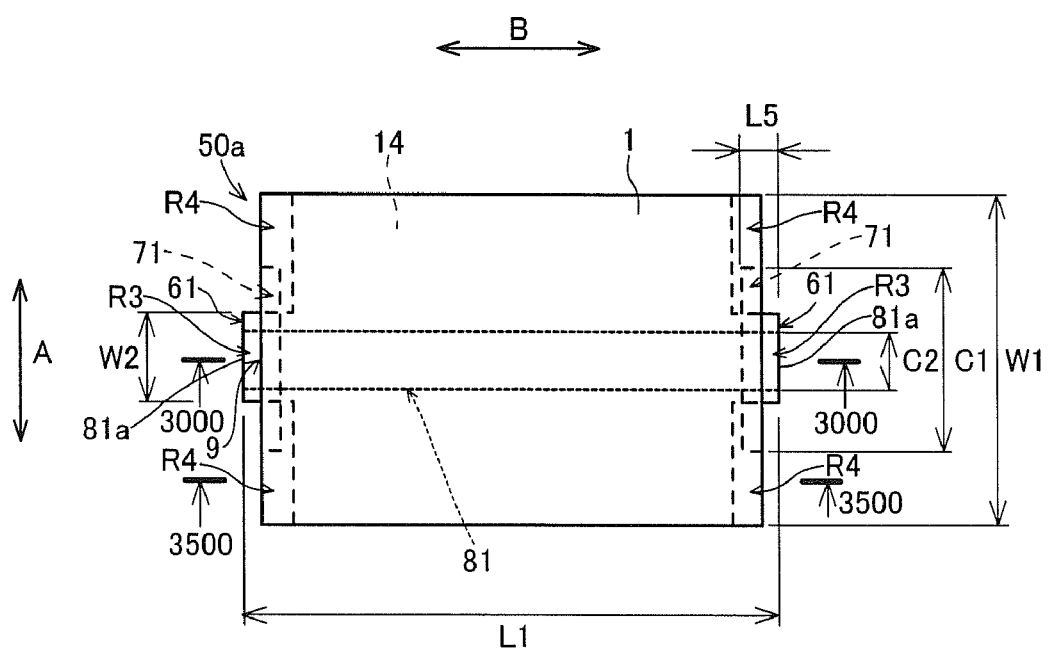
FIG. 16 is a plan view of a semiconductor laser device according to a second embodiment of the present invention.
Figure 17:
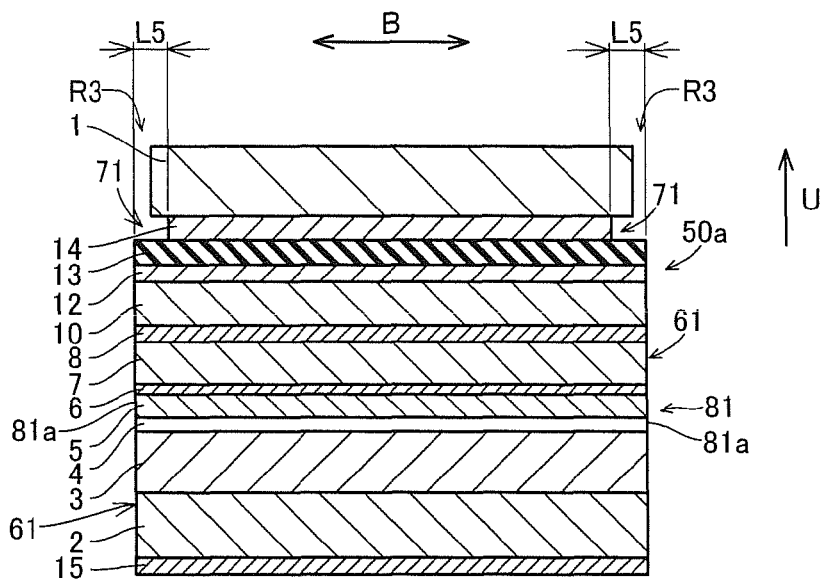
FIG. 17 is a sectional view of the semiconductor laser device according to the second embodiment taken along the line 3000-3000 in FIG. 16.
Figure 18:
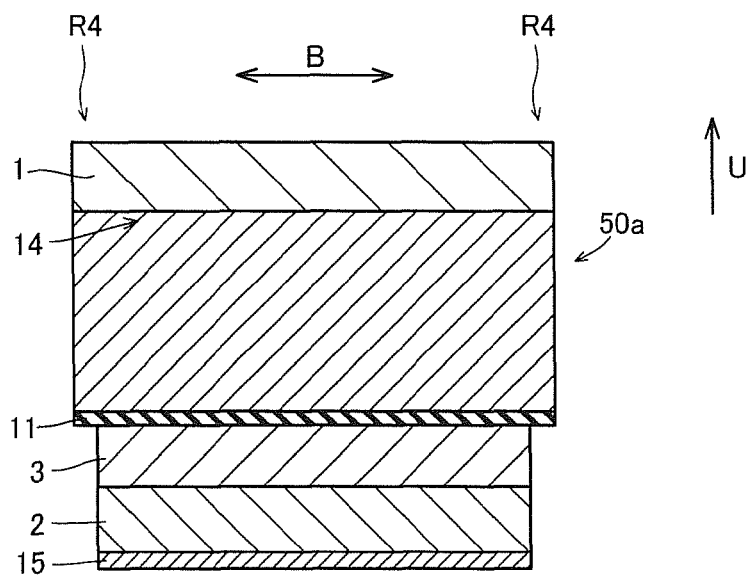
FIG. 18 is a sectional view taken along the line 3500-3500 in FIG. 16, for illustrating the manufacturing process for the semiconductor laser device according to the second embodiment shown in FIG. 16.
Figure 19:
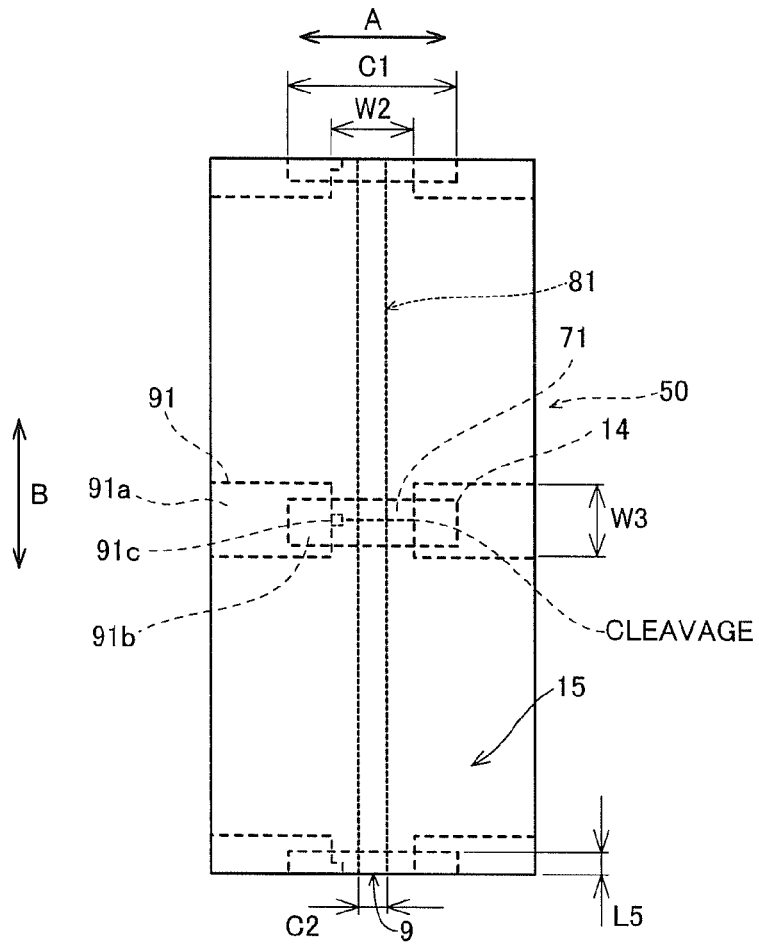
FIG. 19 is a plan view of the semiconductor laser device according to the second embodiment shown in FIG. 16 in an undivided state.

According to the second embodiment, the semiconductor laser device is so formed that a region of the width W2 including the optical waveguide 81 formed under the ridge portion 9 defining the side end surfaces of the semiconductor laser element portion 50a protrudes from the side end surfaces of the semiconductor element portion 50a in the extensional direction (along arrow B in FIG. 16) of the ridge portion 9, as shown in FIG. 16. The width W2 is about 10 μm, and larger than the width C2. The width W2 is smaller than the width W1 of the semiconductor element portion 50a other than the vicinity of the ends 81a. W2 is an example of the "width of semiconductor laser element portion in the vicinity of ends of optical waveguide" in the present invention. The cavity facets 61 consisting of cleavage planes are formed on the side surfaces of the ridge portion 9 and the region located under the ridge portion 9 by cleaving the ridge portion 9 of the semiconductor laser element portion 50a and the region located under the ridge portion 9, as shown in FIGS. 17 and 19. Further, the void portions 71 provided with no solder layer 14 are formed on planar regions R3 close to the ends 81a of the optical waveguide 81 and located above the ends 81a of the optical waveguide 81 (along arrow U) in the vicinity of the cavity facets 61 of the semiconductor laser element portion 50a between the support substrate 1 and the semiconductor laser element portion 50a, as shown in FIGS. 16 and 17. These void portions 81 are inwardly separated from extension lines of the cavity facets 61 by an interval (L5) of about 30 μm with a width (C1) of about 50 μm around the optical waveguide 81, and the width W2 is smaller than the width C1. In the vicinity of the cavity facets 61 of the semiconductor laser element portion 50a between the support substrate 1 and the semiconductor laser element portion 50a, the support substrate 1 and the semiconductor laser element portion 50a are bonded to each other through the solder layer 14 on planar regions R4 other than those close to the ends 81a of the optical waveguide 81 similarly to the aforementioned first embodiment, as shown in FIGS. 16 and 18. Further, the support substrate 1 and the semiconductor laser element portion 50a are bonded to each other through the solder layer 14 on portions adjacent to the void portions 71 and the planar regions R4 in the direction B respectively.

The remaining structure of the second embodiment is similar to that of the aforementioned first embodiment.

According to the second embodiment, as hereinabove described, the ridge portion 9 and the region located under the ridge portion 9 protrude from the side end surfaces of the semiconductor laser element portion 50a in the extensional direction of the ridge portion 9 and the cavity facets 61 are formed on the side end surfaces of the ridge portion 9 and the region located under the ridge portion 9, whereby the cavity facets 61 consisting of cleavage planes can be easily formed on the side end surfaces of the ridge portion 9 by cleaving the portions, having a small cleavage width, of the ridge portion 9 and the region located under the ridge portion 9 protruding in the extensional direction of the ridge portion 9.

The remaining effects of the second embodiment are similar to those of the aforementioned first embodiment.

A method of manufacturing the semiconductor laser device according to the second embodiment is now described with reference to FIGS. 16, 18 and 19.

First, the semiconductor laser element portion 50a and the support substrate 1 are bonded to each other through the solder layer 14 through a process similar to that of the aforementioned first embodiment. Then, regions 91 (see FIG. 19) of the semiconductor laser element portion 50a are etched until an insulating film 11 (see FIG. 18) is exposed from the side of an electrode 15 (see FIG. 18), as shown in FIGS. 18 and 19. The regions 91 consist of regions 91a, located under the solder layer 14, adjacent to the void portions 71 along arrow A and regions 91b located under the void portions 71 in portions located on extension lines of the cleavage planes formed on the semiconductor laser element portion 50a, as shown in FIG. 19. Thereafter notches 91c are formed in the regions 91b. Consequently, the region including the optical waveguide 81 is formed into the width W2, and the regions 91a are formed into a width W3. Thereafter the region of the semiconductor laser element portion 50a having the width W2 is cleaved along the (1-100) plane perpendicular to the main surface of the support substrate 1. The notches 91c are so formed that the semiconductor laser element portion 50a is easily cleaved along the portions provided with the notches 91c, whereby the cleavage positions can be easily controlled.

Then, only the support substrate 1 is diced with a width of about 40 μm for dividing the device, similarly to the aforementioned first embodiment. Thus, the semiconductor laser device according to the second embodiment is formed as shown in FIG. 16.

The remaining manufacturing process for the semiconductor laser device according to the second embodiment is similar to that in the aforementioned first embodiment.

Third Embodiment

Figure 20:
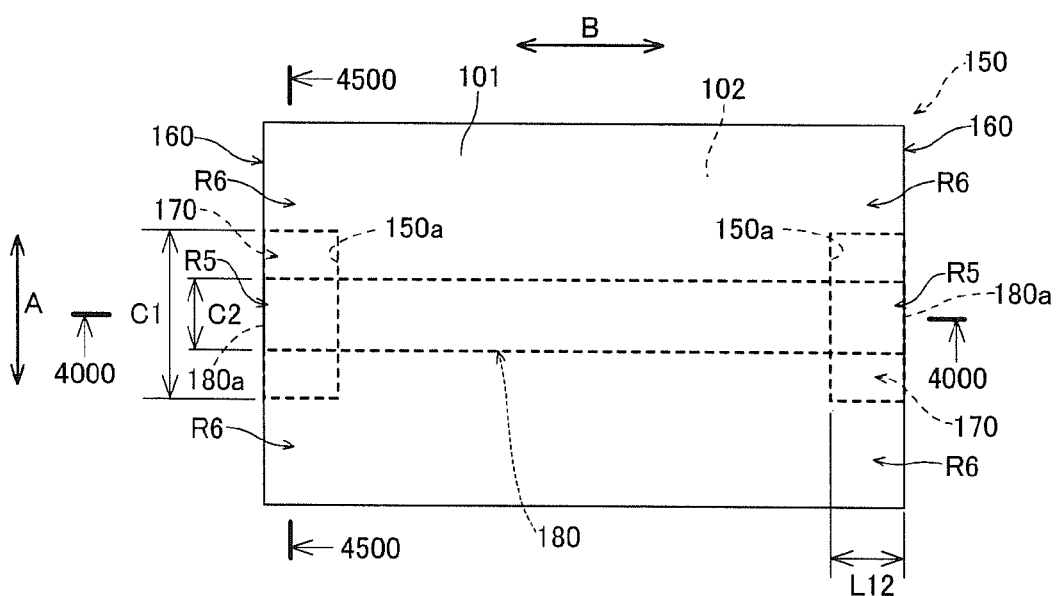
FIG. 20 is a plan view of a semiconductor laser device according to a third embodiment of the present invention.
Figure 21:
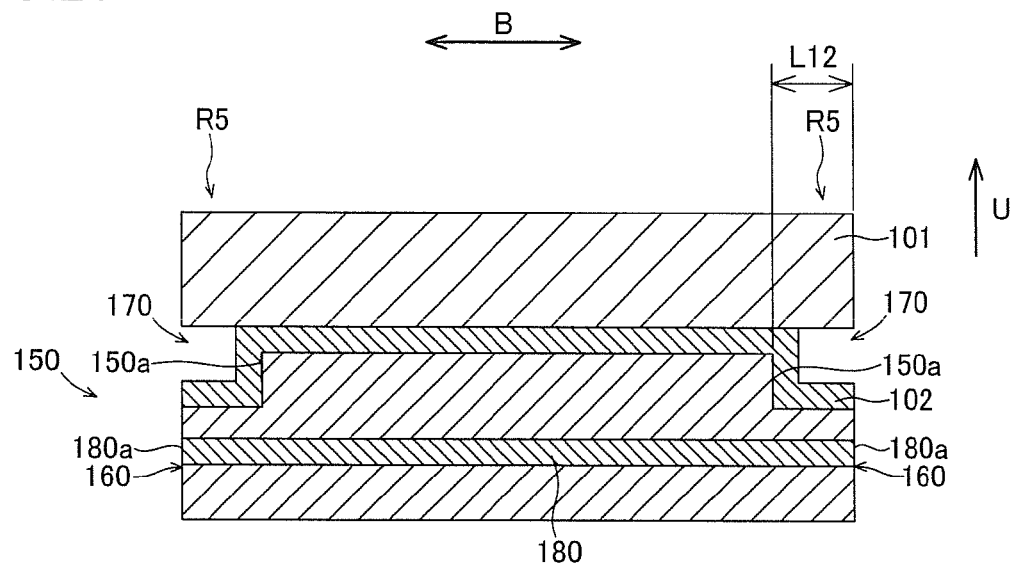
FIG. 21 is a sectional view of the semiconductor laser device according to the third embodiment taken along the line 4000-4000 in FIG. 20.
Figure 22:
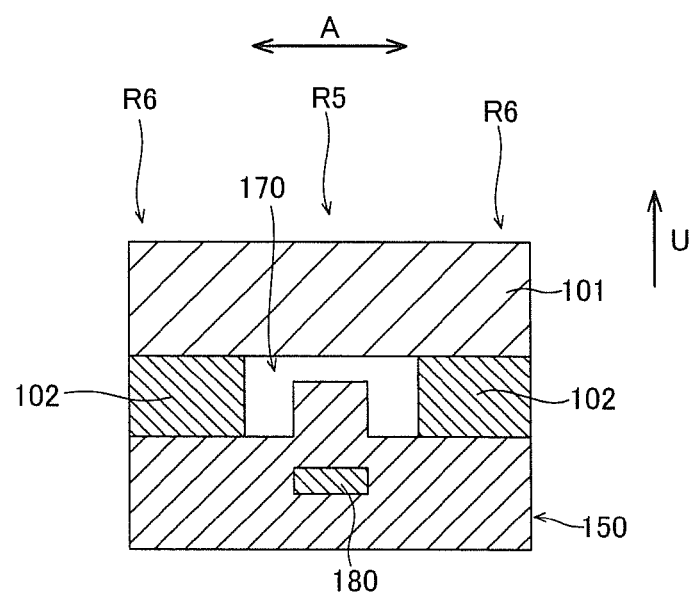
FIG. 22 is a sectional view of the semiconductor laser device according to the third embodiment taken along the line 4500-4500 in FIG. 20.

FIG. 20 is a plan view of a semiconductor laser device according to a third embodiment of the present invention. FIG. 21 is a sectional view of the semiconductor laser device according to the third embodiment taken along the line 4000-4000 in FIG. 20. FIG. 22 is a sectional view of the semiconductor laser device according to the third embodiment taken along the line 4500-4500 in FIG. 20. Referring to FIGS. 20 to 22, step portions 150a (see FIG. 21) are provided on a surface of a semiconductor laser element portion 150 closer to a support substrate 101 by etching in the semiconductor laser device according to the third embodiment, dissimilarly to the aforementioned first and second embodiments. The step portions 150a are examples of the "first step portions" in the present invention.

In the semiconductor laser device according to the third embodiment, the support substrate 101 and the semiconductor laser element portion 150 are bonded to each other through a solder layer 102, as shown in FIGS. 20 to 22. The solder layer 102 is an example of the "bonding layer" in the present invention. The semiconductor laser element portion 150 is provided with a pair of cavity facets 160 consisting of cleavage planes, as shown in FIGS. 20 and 21. The semiconductor laser element portion 150 is also provided with an optical waveguide 180 having a width C2 (see FIG. 20).

According to the third embodiment, the step portions 150a are provided on the surface of the semiconductor laser element portion 150 closer to the support substrate 101 on planar regions R5 close to ends 180a of the optical waveguide 180 and located above the ends 180a of the optical waveguide 180 (along arrow U) in the vicinity of the cavity facets 160 of the semiconductor laser element portion 150 between the support substrate 101 and the semiconductor laser element portion 150. The step portions 150a have a width C1 in the direction (along arrow A) perpendicular to the optical waveguide 180. The step portions 150a are formed on positions inwardly separated from extension lines of the cavity facets 160 by an interval L12. The step portions 150a are located above the optical waveguide 180.

According to the third embodiment, void portions 170 provided with no solder layer 102 are formed on the planar regions R5 between the support substrate 101 and the semiconductor laser element portion 150, similarly to the aforementioned first embodiment. As shown in FIGS. 20 and 22, the support substrate 101 and the semiconductor laser element portion 150 are bonded to each other through the solder layer 102 on planar regions R6 other than those close to the ends 180a of the optical waveguide 180 in the vicinity of the cavity facets 160 of the semiconductor laser element portion 150 between the support substrate 101 and the semiconductor laser element portion 150.

The remaining structure of the third embodiment is similar to that of the aforementioned first embodiment.

According to the third embodiment, as hereinabove described, the step portions 150a are provided on the surface of the semiconductor laser element portion 150 closer to the support substrate 101 on the planar regions R5 for forming the void portions 170 provided with no solder layer 102 between the support substrate 101 and the semiconductor laser element portion 150 through these step portions 150a, whereby the void portions 170 provided with no solder layer 102 can be easily formed between the support substrate 101 and the semiconductor laser element portion 150 on the planar regions R5 through the step portions 150a provided on the surface of the semiconductor laser element portion 150 closer to the support substrate 101 even when the solder layer 102 is formed on the overall surface of the support substrate 101 closer to the semiconductor laser element portion 150.

The remaining effects of the third embodiment are similar to those of the aforementioned first embodiment.

Figure 23:
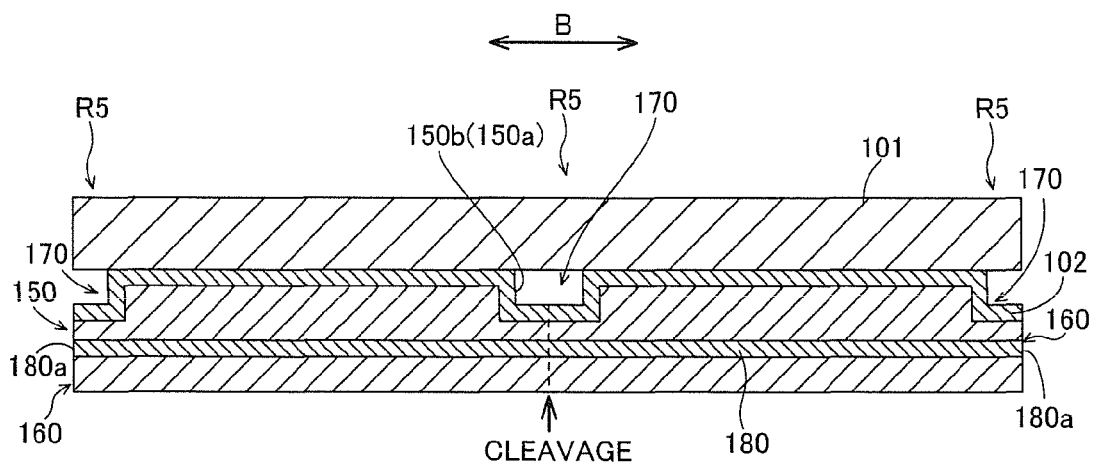
FIG. 23 is a sectional view taken along the line 4000-4000 in FIG. 20, for illustrating a manufacturing process for the semiconductor laser device according to the third embodiment shown in FIG. 20.

A manufacturing process for the semiconductor laser device according to the third embodiment is described with reference to FIGS. 20 to 23. FIG. 23 is a sectional view in the same direction as FIG. 21.

First, a recess portion 150b (see FIG. 23) for forming the step portions 150a is provided on the semiconductor laser element portion 150 prepared on a growth substrate (not shown) similarly to the aforementioned first embodiment, to be located above the optical waveguide 180 (see FIG. 21). The recess portion 150b is an example of the "first recess portion" in the present invention. Then, the solder layer 102 (see FIG. 21) is formed on the overall surface of the support substrate 101 (see FIG. 21) closer to the semiconductor laser element portion 150. Thereafter the support substrate 101 and the semiconductor laser element portion 150 are bonded to each other through the solder layer 102. At this time, the void portions 170 provided with no solder layer 102 are formed between the support substrate 101 and the semiconductor laser element portion 150 through the recess portion 150b (step portions 150a) in the vicinity of the planar regions R5 (see FIG. 21). Then, the growth substrate (not shown) is separated from the semiconductor laser element portion 150, thereby obtaining the sectional shape shown in FIG. 23.

Thereafter scribing grooves (not shown) are provided on the surface of the semiconductor laser element portion 150 perpendicular to the main surface of the support substrate 101, for cleaving the semiconductor laser element portion 150. Finally, only the support substrate 101 is separated by dicing or the like for dividing the semiconductor laser element portion 150, similarly to the aforementioned first embodiment. Thus, the semiconductor laser device according to the third embodiment is formed with the step portions 150a shown in FIGS. 20 to 22.

The remaining manufacturing process for the semiconductor laser device according to the third embodiment is similar to that of the aforementioned first embodiment.

Fourth Embodiment

Figure 24:
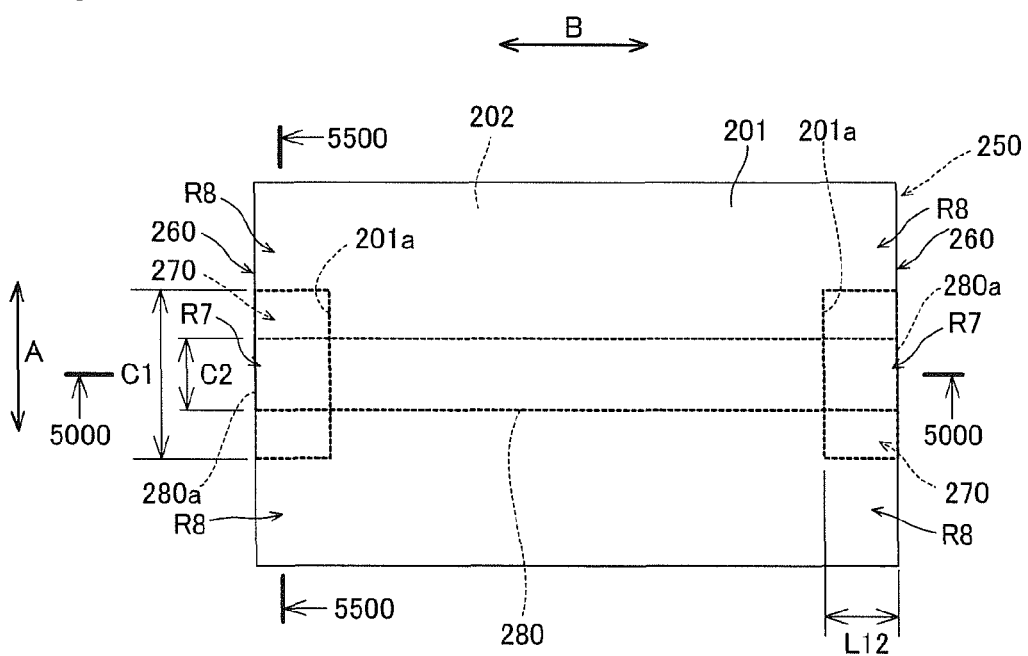
FIG. 24 is a plan view of a semiconductor laser device according to a fourth embodiment of the present invention.
Figure 25:
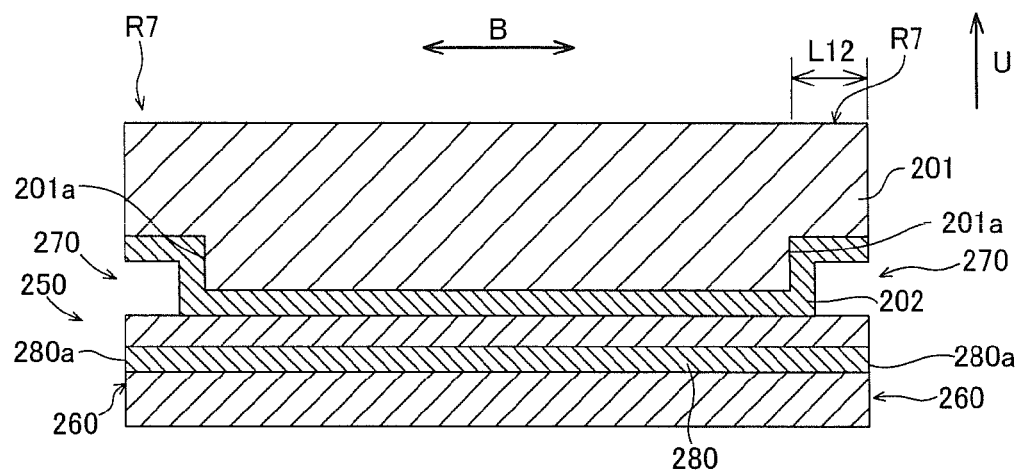
FIG. 25 is a sectional view of the semiconductor laser device according to the fourth embodiment taken along the line 5000-5000 in FIG. 24.
Figure 26:
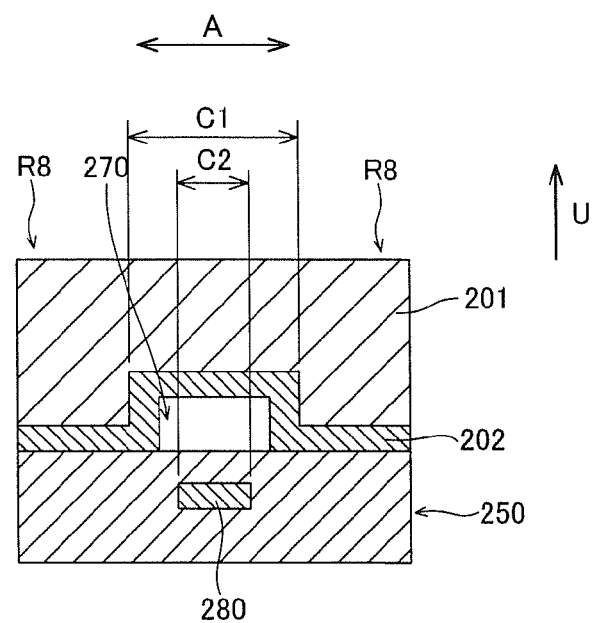
FIG. 26 is a sectional view of the semiconductor laser device according to the fourth embodiment taken along the line 5500-5500 in FIG. 24.

Referring to FIGS. 24 to 26, step portions 201a are provided on a surface of a support substrate 201 closer to a semiconductor laser element portion 250 in a semiconductor laser device according to a fourth embodiment, dissimilarly to the aforementioned third embodiment. The step portions 201a are examples of the "second step portions" in the present invention.

In the semiconductor laser device according to the fourth embodiment, the support substrate 201 and the semiconductor laser element portion 250 are bonded to each other through a solder layer 202, as shown in FIGS. 24 to 26. The solder layer 202 is an example of the "bonding layer" in the present invention. As shown in FIGS. 24 and 25, the semiconductor laser element portion 250 is provided with a pair of cavity facets 260 consisting of cleavage planes. The semiconductor laser element portion 250 is also provided with an optical waveguide 280 having a width C2 (see FIG. 24).

According to the fourth embodiment, the step portions 201a are provided on the surface of the support substrate 201 closer to the semiconductor laser element portion 250 on planar regions R7 close to ends 280a of the optical waveguide 280 and located above the ends 280a of the optical waveguide 280 (along arrow U) in the vicinity of the cavity facets 260 of the semiconductor laser element portion 250 between the support substrate 201 and the semiconductor laser element portion 250. These step portions 201a have a width C1 in a direction (along arrow A) perpendicular to the optical waveguide 280. The step portions 201a are formed on positions inwardly separated from extension lines of the cavity facets 260 by an interval L12. Thus, the side of the solder layer 202, provided on the support substrate 201, closer to the semiconductor laser element portion 250 is also stepped. The step portions 201a are located above the optical waveguide 280.

According to the fourth embodiment, void portions 270 provided with no solder layer 202 are formed between the support substrate 201 and the semiconductor laser element portion 250 on the planar regions R7, similarly to the aforementioned first and third embodiments. As shown in FIGS. 24 and 26, the support substrate 201 and the semiconductor laser element portion 250 are bonded to each other through the solder layer 202 on planar regions R8 other than those close to the ends 280a of the optical waveguide 280 in the vicinity of the cavity facets 260 of the semiconductor laser element portion 250 between the support substrate 201 and the semiconductor laser element portion 250.

The remaining structure of the semiconductor laser device according to the fourth embodiment is similar to those of the aforementioned first and third embodiments.

According to the fourth embodiment, as hereinabove described, the step portions 201a are provided on the surface of the support substrate 201 closer to the semiconductor laser element portion 250 and the void portions 270 provided with no solder layer 202 are formed between the support substrate 201 and the semiconductor laser element portion 250 through the step portions 201a, whereby the void portions 270 provided with no solder layer 202 can be easily formed between the support substrate 201 and the semiconductor laser element portion 250 on the planar regions R7 through the step portions 201a provided on the surface of the support substrate 201 closer to the semiconductor laser element portion 250 even when the solder layer 202 is formed on the overall surface of the support substrate 201 closer to the semiconductor laser element portion 250.

The remaining effects of the semiconductor laser device according to the fourth embodiment are similar to those of the aforementioned first and third embodiments.

Figure 27:
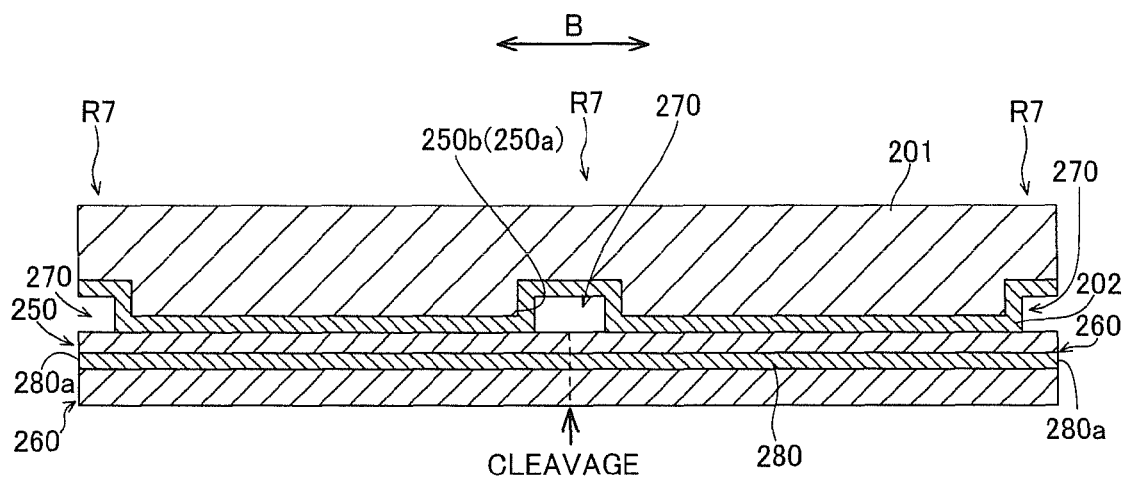
FIG. 27 is a sectional view taken along the line 5000-5000 in FIG. 24, for illustrating a manufacturing process for the semiconductor laser device according to the fourth embodiment shown in FIG. 24.
Figure 28:
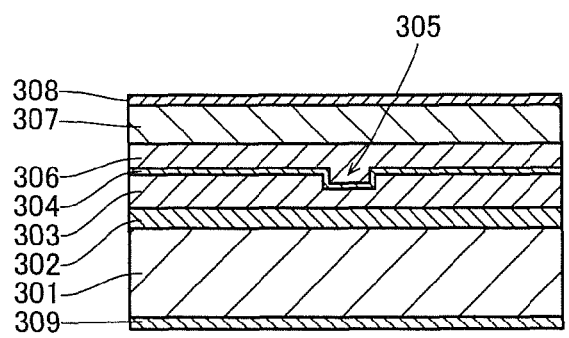
FIG. 28 is a sectional view showing a conventional semiconductor laser device disclosed in IEICE Technical Report Vol. 102 LQE2002-85, pp. 55 to 57.
Figure 29:
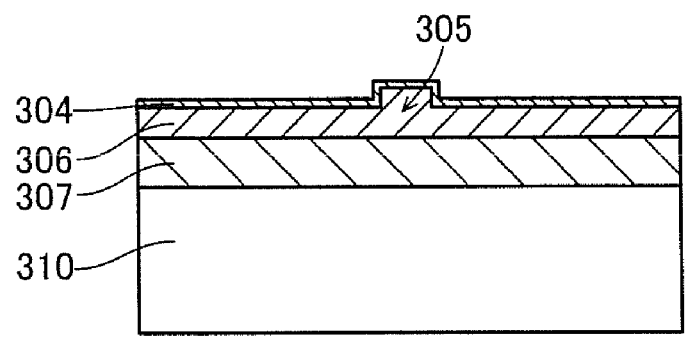
FIGS. 29 to 31 are sectional views for illustrating a method (LLO) of manufacturing the conventional semiconductor laser device disclosed in IEICE Technical Report Vol. 102 LQE2002-85, pp. 55 to 57.
Figure 30:
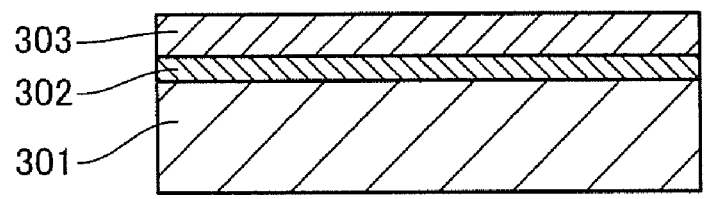
Figure 31:
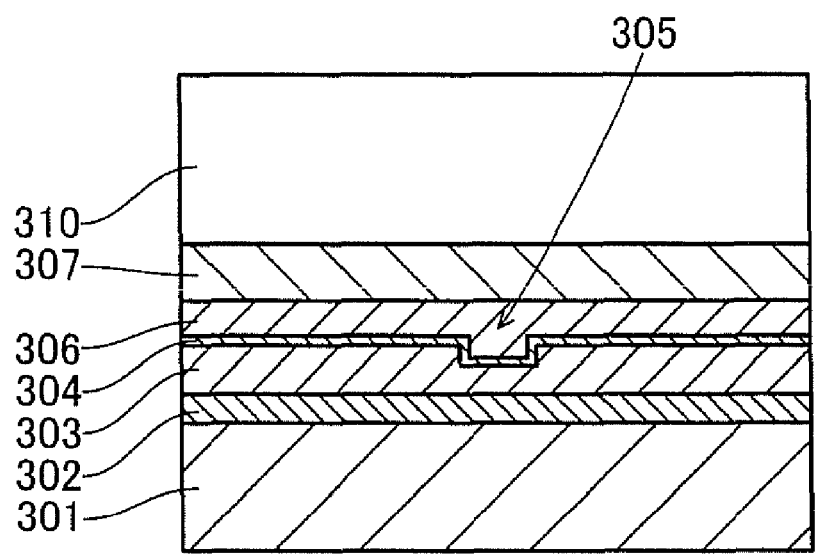

A manufacturing process for the semiconductor laser device according to the fourth embodiment is described with reference to FIGS. 24 to 27. FIG. 27 is a sectional view in the same direction as FIG. 25.

First, the solder layer 202 (see FIG. 25) is formed on the overall surface, closer to the semiconductor laser element portion 250, of the support substrate 201 (see FIG. 25) having a recess portion 201b (see FIG. 27) for forming the step portions 201a on the surface closer to the semiconductor laser element portion 250. The recess portion 201b is an example of the "second recess portion" in the present invention. Then, the support substrate 201 and the semiconductor laser element portion 250 prepared on a growth substrate (not shown) similarly to the first embodiment are bonded to each other through the solder layer 202. At this time, the support substrate 201 and the semiconductor laser element portion 250 are so aligned with each other that the optical waveguide 280 is located under the recess portion 201b (step portions 201a). Thus, the void portions 270 provided with no solder layer 202 are formed between the support substrate 201 and the semiconductor laser element portion 250 through the recess portion 201b (step portions 201a) in the vicinity of the planar regions R7 (see FIG. 25). Thereafter the growth substrate (not shown) is separated from the semiconductor laser element portion 250, thereby obtaining the sectional shape shown in FIG. 27.

Then, scribing grooves (not shown) are provided on the surface of the semiconductor laser element portion 250 perpendicular to the main surface of the support substrate 201, for cleaving the semiconductor laser element portion 250. Finally, only the support substrate 201 is separated by dicing or the like for dividing the semiconductor laser element portion 250, similarly to the aforementioned first and third embodiments. Thus, the semiconductor laser device according to the fourth embodiment is formed with the step portions 201a shown in FIGS. 24 to 26.

The remaining manufacturing process for the semiconductor laser device according to the fourth embodiment is similar to those of the aforementioned first and third embodiments.

Although the present invention has been described and illustrated in detail, it is clearly understood that the same is by way of illustration and example only and is not to be taken by way of limitation, the spirit and scope of the present invention being limited only by the terms of the appended claims.

For example, while each of the aforementioned first to fourth embodiments is applied to the device consisting of a nitride-based semiconductor, the present invention is not restricted to this but may alternatively be applied to a device of an oxide-based semiconductor such as ZnO. The semiconductor may have either a wurtzite crystal structure or a zinc blende crystal structure. Further, the plane orientation of crystal growth is not restricted to [0001], but may alternatively be [11-20] or [1-100].

While the solder layer of AuSn is employed as the bonding layer in each of the aforementioned first to fourth embodiments, the present invention is not restricted to this but a solder layer made of a material other than AuSn may alternatively be employed as the bonding layer. For example, a solder layer of InSn, SnAgCu, SnAgBi, SnAgCuBi, SnAgBiIn, SnZn, SnCu, SnBi, SnZnBi or the like may be employed as the bonding layer. Further, a material such as electrically conductive paste may be employed for the bonding layer.

While the electrically conductive substrate of Cu—W having no cleavability is employed as the support substrate in each of the aforementioned first to fourth embodiments, the present invention is not restricted to this but an electrically conductive substrate having cleavability may alternatively be employed. For example, a semiconductor substrate of Si, SiC, GaAs, ZnO or the like may be employed. Further, a metal plate of Al or Fe—Ni, an electrically conductive resin film containing electrically conductive particles of metal or the like dispersed therein or a composite material of metal and a metal oxide may be employed.

While the active layer having the MQW structure is employed in each of the aforementioned first to fourth embodiments, the present invention is not restricted to this but a thick-film single active layer having no quantum effect or an active layer having a single quantum well (SQW) structure may alternatively be employed.

While the underlayer for selective growth is removed by dry etching in each of the aforementioned first to fourth embodiments, the present invention is not restricted to this but the underlayer for selective growth may alternatively be removed by a method such as LLO other than dry etching.

While the solder layer is formed on the surface of the support substrate by patterning in each of the aforementioned first and second embodiments, the present invention is not restricted to this but the solder layer may alternatively be formed on the surface of the support substrate by a method other than patterning.

While the void portions provided with no bonding layer (solder layer) are formed on the regions of the cavity facets of the semiconductor laser element portion in the vicinity of the optical waveguide in each of the aforementioned first to fourth embodiments, the present invention is not restricted to this but the void portions may alternatively be formed along overall regions (overall cross-directional region of the semiconductor laser element portion) of the cavity facets other than those in the vicinity of the optical waveguide.

What is claimed is:

1. A semiconductor laser device comprising:
   a support substrate;
   a semiconductor laser element portion having a pair of cavity facets provided with ends of an optical waveguide extending in a first direction; and
   a bonding layer bonding said support substrate and said semiconductor laser element portion to each other, wherein
   said bonding layer has void portions formed on first regions including at least said ends of said optical waveguide in the vicinity of said cavity facets,
   said support substrate and said semiconductor laser element portion are bonded to each other through said bonding layer formed on a second region, and
   said second region is formed in the vicinity of said cavity facets other than said first regions and both said first regions and said second region contact said cavity facets.

2. The semiconductor laser device according to claim 1, wherein
   the width of said void portions in a second direction perpendicular to said first direction is larger than the width of said ends of said optical waveguide in said second direction.

3. The semiconductor laser device according to claim 2, wherein
   the width of said semiconductor laser element portion in said second direction in the vicinity of said ends of said optical waveguide is smaller than the width of said void portions in said second direction and larger than the width of said ends of said optical waveguide in said second direction.

4. The semiconductor laser device according to claim 1, wherein
said cavity facets are so formed that said ends of said optical waveguide of said semiconductor laser element portion protrude in said first direction beyond ends of said support substrate in said first direction.

5. The semiconductor laser device according to claim 1, wherein
said semiconductor laser element portion includes a nitride-based semiconductor layer.

6. The semiconductor laser device according to claim 1, wherein
said support substrate and said bonding layer are electrically conductive.

7. The semiconductor laser device according to claim 1, wherein
first step portions are provided on the surface of said semiconductor laser element portion in the vicinity of said void portions.

8. The semiconductor laser device according to claim 1, wherein
second step portions are provided on the surface of said support substrate in the vicinity of said void portions.

9. The semiconductor laser device according to claim 1, wherein
said support substrate has no cleavability.

10. The semiconductor laser device according to claim 1, wherein
said support substrate is constituted by any of a semiconductor (Cu—W, Si, SiC, GaAs or ZnO), metal (Al or Fe—Ni), an electrically conductive resin film containing particles of metal dispersed therein and a composite material of metal and metal oxide.

11. The semiconductor laser device according to claim 1, wherein
said bonding layer is constituted by either a solder layer or electrically conductive paste.

12. The semiconductor laser device according to claims 11, wherein
said solder layer is made of any of AuSn, InSn, SnAgCu, SnAgBi, SnAgCuBi, SnAgBiIn, SnZn, SnCu, SnBi and SnZnBi.

13. The semiconductor laser device according to claim 1, wherein
a side end surface of said support substrate is arranged on a position inwardly deviating from extension lines of said cavity facets.

14. The semiconductor laser device according to claim 1, wherein
said semiconductor laser element portion has a ridge portion for forming said optical waveguide.

15. The semiconductor laser device according to claim 1, wherein
a pad electrode is formed on a surface of said semiconductor laser element portion on a side of said support substrate.

16. The semiconductor laser device according to claim 15, wherein
an ohmic electrode is formed between said semiconductor laser element portion and said pad electrode.

17. The semiconductor laser device according to claim 15, wherein
said bonding layer has a first end in said first direction on a side of said cavity facets and said pad electrode has a second end in said first direction on a side of said cavity facets in said ends of said optical waveguide, and
said first end is located inside with respect to said second end and a side end surface of said support substrate.

18. The semiconductor laser device according to claim 1, wherein
a side end surface of said support substrate is arranged on a position outwardly deviating from extension lines of said cavity facets in a region other than the vicinity of said ends of said optical waveguide in the vicinity of said cavity facets.

19. The semiconductor laser device according to claim 1, wherein
said bonding layer has a first end in said first direction on a side of said cavity facets, and said first end is arranged on a position inwardly deviating from extension lines of said cavity facets in a region other than the vicinity of said ends of said optical waveguide in the vicinity of said cavity facets.

20. The semiconductor laser device according to claim 1, wherein
said ends of said optical waveguide are so formed as to protrude from side end surfaces of said semiconductor laser element portion other than the vicinity of said ends of said optical waveguide in said first direction.

\* \* \* \* \*